US006717867B2

(12) United States Patent
Marr

(10) Patent No.: US 6,717,867 B2
(45) Date of Patent: Apr. 6, 2004

(54) SRAM POWER-UP SYSTEM AND METHOD

(75) Inventor: Ken W. Marr, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/349,462

(22) Filed: Jan. 21, 2003

(65) Prior Publication Data

US 2003/0128595 A1 Jul. 10, 2003

Related U.S. Application Data

(62) Division of application No. 10/032,312, filed on Dec. 21, 2001.

(51) Int. Cl.⁷ .............................. G11C 7/00; G11C 11/00
(52) U.S. Cl. .................. 365/189.09; 365/154; 365/156; 365/202; 365/226; 365/195; 365/196; 365/188; 365/189.11
(58) Field of Search ................................. 365/154, 156, 365/189.09, 202, 226, 195, 196, 188, 189.11

(56) References Cited

U.S. PATENT DOCUMENTS

| 4,918,663 A | * | 4/1990 | Remington et al. ......... 365/226 |
| 5,400,294 A | | 4/1993 | Srinivasan et al. ..... 365/230.06 |
| 5,404,331 A | * | 4/1995 | McClure ..................... 365/200 |
| 5,473,562 A | * | 12/1995 | Liu ............................ 365/154 |
| 5,555,166 A | | 9/1996 | Sher ............................ 363/49 |
| 5,557,579 A | | 9/1996 | Raad et al. .................. 365/226 |
| 5,768,206 A | * | 6/1998 | McClure .................. 365/225.7 |
| 5,880,988 A | | 3/1999 | Bertin et al. .................. 365/63 |
| 5,898,625 A | | 4/1999 | Manning ................ 365/189.09 |
| 5,976,926 A | * | 11/1999 | Wu et al. ..................... 438/237 |
| 5,982,682 A | | 11/1999 | Nevill et al. ................. 365/201 |
| 6,002,610 A | * | 12/1999 | Cong et al. ............. 365/185.05 |
| 6,081,464 A | | 6/2000 | Marr ........................... 365/201 |
| 6,103,579 A | | 8/2000 | Violette ....................... 438/279 |
| 6,157,558 A | * | 12/2000 | Wong ........................... 365/49 |
| 6,163,476 A | | 12/2000 | Marr et al. .................. 365/154 |
| 6,198,670 B1 | | 3/2001 | Marr ..................... 365/189.09 |
| 6,198,682 B1 | * | 3/2001 | Proebsting ................... 365/207 |
| 6,288,966 B2 | | 9/2001 | Marr ........................... 365/226 |
| 6,330,195 B2 | | 12/2001 | Marr ..................... 365/189.09 |
| 6,337,813 B2 | | 1/2002 | Marr ..................... 365/189.09 |
| 6,341,088 B2 | | 1/2002 | Sakamoto et al. .......... 365/190 |
| 6,373,756 B2 | | 4/2002 | Marr ..................... 365/189.09 |
| 6,388,933 B2 | | 5/2002 | Marr ........................... 365/211 |
| 6,496,422 B2 | | 12/2002 | Marr ..................... 365/189.09 |
| 6,529,421 B1 | | 3/2003 | Marr et al. ............. 365/189.09 |
| 6,556,487 B1 | * | 4/2003 | Ratnakumar et al. .. 365/189.08 |
| 2001/0022752 A1 | | 9/2001 | Duesman ..................... 365/201 |
| 2002/0020885 A1 | * | 2/2002 | Rockett ....................... 257/369 |

FOREIGN PATENT DOCUMENTS

EP         581443 A2  *  2/1994   ............ G11C/7/00

* cited by examiner

Primary Examiner—David Nelms
Assistant Examiner—Ly Duy Pham
(74) Attorney, Agent, or Firm—Dorsey & Whitney LLP

(57) ABSTRACT

A power-up circuit for an SRAM, particularly a loadless 4-T SRAM cell having PMOS access transistors. The power-up circuit disables a current path to the digit lines in an array of SRAM cells during power-up of the SRAM. As a result, the SRAM cells cannot draw power from the digit lines during power-up if voltages on word lines in the array during power-up cause access transistors for the SRAM cells to become conductive.

12 Claims, 9 Drawing Sheets

SRAM POWER-UP SYSTEM AND METHOD

CROSS-REFERENCE TO RELATED APPLICATION

This application is a divisional of pending U.S. patent application Ser. No. 10/032,312, filed Dec. 21, 2001.

TECHNICAL FIELD

This invention relates to static random access memory ("SRAM") devices, and, more particularly, to a system and method for powering-up SRAM devices having PMOS access transistors to limit the initial current draw of such SRAM devices.

BACKGROUND OF THE INVENTION

Many integrated circuit devices, such as microprocessors, include onboard memory devices, such as SRAM devices. For example, SRAM devices are commonly used as cache memory because of their relatively fast speed. SRAM devices are also sold as stand-alone integrated circuits for use as cache memory and for other uses. SRAM devices are also more suitable for use as cache memory than dynamic random access memory ("DRAM") devices because they need not be refreshed, thus making all SRAM memory cells continuously available for a memory access.

FIG. 1 is a block diagram of a portion of a typical array 10 of SRAM cells 12 arranged in rows and columns. A plurality of complementary digit line pairs D, D* are used to couple complementary data to and from the memory cells 12 in a respective column. Several digit line pairs, typically 16 or 32 digit line pairs, are coupled to respective inputs of a column multiplexer 13. The column multiplexer 13 couples one pair of digit lines corresponding to a column address to a sense amplifier 14 and a write driver 16. The sense amplifer 14 provides a data output (not shown) indicative of the polarity of one digit line D relative to the other D* responsive to data being read from a memory cell 12 coupled to the selected digit line pair D, D*. The write driver 16 drives a differential voltage onto the digit lines D, D* to which the write driver 16 is coupled by the column multiplexer 13. The differential voltage applied between the digit lines is indicative of data that is to be written to a memory cell 12 coupled to the digit lines D, D*. An equilibration PMOS transistor 18 is also coupled between each pair of complementary digit lines D, D* to equalize the voltage between the digit lines D, D* prior to a memory read operation. Finally, a complementary PMOS bias transistor 20 is coupled to each digit line D, D* to lightly bias the digit lines D, D* to $V_{cc}$ for reasons that will be explained. The current provided by each pair of bias transistors is controlled by a respective digit line load signal $DLL_N$.

A plurality of word lines WL1–WL4 are used to activate the memory cells 12 in the respective row of memory cells. The word lines WL1–WL4 are coupled to a respective inverter 30 each formed by a PMOS transistor 34 and an NMOS transistor 36 coupled in series between $V_{cc}$ and ground. The gates of the transistors 34, 36 are coupled to each other and to a respective select line SEL WL1–SEL WL4.

In a read operation, the digit lines D, D* for all columns are equilibrated by driving an EQ* line low. An inverter 30 then drives a word line WL1–WL4 in a single row to an appropriate voltage, thereby coupling a memory cell 12 in each column to a respective pair of digit lines D, D*. The memory cell 12 in each column unbalances the digit lines D, D* to which it is coupled, and the respective sense amplifier 14 senses the polarity of the unbalance and provides an appropriate data signal.

In a write operation, a suitable voltage is first applied to a word line WL1–WL4 to couple the memory cells 12 in the respective row to a digit line D or a complimentary digit line D*. The write driver 18 for one or more columns then applies a differential voltage between the digit lines D, D* for respective columns, which is coupled to respective memory cells 12 for the activated row. The write driver 18 is then disabled for a "rite recovery" phase, and the word line WL1–WL4 is then deactivated so the memory cell 12 stores the polarity of the differential voltage. The bias transistors 20 are provided for the array 10 regardless of the type of SRAM cell used. However, in the event the memory cells 12 are loadless 4T memory cells, which are discussed further below, the current provided by the bias transistors 20 allow the memory cells 12 to continue to store the data, as also discussed further below.

A typical memory cell shown in FIG. 2 is a conventional 6-transistor (6-T) SRAM cell 40. The SRAM cell 40 includes a pair of NMOS access transistors 42 and 44 that allow a differential voltage on the digit lines D, D*, to be read from and written to a storage circuit 50 of the SRAM cell 40. The storage circuit 50 includes NMOS pull-down transistors 52 and 56 that are coupled in a positive-feedback configuration with PMOS pull-up transistors 54 and 58, respectively. Nodes A and B are complementary inputs/output nodes of the storage circuit 50, and the respective complementary logic values at these nodes represent the state of the SRAM cell 40. For example, when the node A is at logic "1" and the node B is at logic "0", then the SRAM cell 40 is storing a logic "1". Conversely, when the node A is at logic "0" and the node B is at logic "1", then the SRAM cell 40 is storing a logic "0". Thus, the SRAM cell 40 is bistable, i.e., the SRAM cell 40 can have one of two stable states, logic "1" or logic "0".

In operation during a read of the SRAM cell 40, a word-line WL, such as WL1–WL4 (FIG. 1), which is coupled to the gates of the access transistors 42 and 44, is driven to a voltage approximately equal to $V_{cc}$ to turn ON the transistors 42 and 44. The access transistor 42 then couples the node A to the digit line D, and the access transistor 44 couples the node B to the digit line D*. Assuming the SRAM cell 40 is storing a logic "0", coupling the digit line D to the node A pulls down the voltage on the digit line D enough (for example, 100–500 millivolts) to cause the sense amplifier 14 (FIG. 1) coupled between the digit lines D, D* to read the SRAM cell 40 as storing a logic "0".

During a write operation of a logic "1" to the SRAM cell 40, for example, a logic "1" is applied to the digit lines D, D* as a differential voltage, and the word line WL is activated to turn ON the access transistors 42, 44. The transistor 42 then couples the logic "1" voltage of approximately $V_{cc}$ to the node A, and the transistor 44 couples the logic "0" voltage of approximately ground to the node B. The word line WL is finally deactivated to turn OFF the access transistors 42, 44, thereby allowing the SRAM cell 40 to continue storing the logic "1".

Although the 6-T cell 40 shown in FIG. 2 uses PMOS pull-up transistors 54, 58, it will be understood that other components (not shown), such as pull-up resistors (not shown), may be used in place of the pull-up transistors 54, 58.

Another typical SRAM cell is shown in FIG. 3. The SRAM cell shown in FIG. 3 is a conventional 4-transistor (4-T) loadless SRAM cell 60, where elements common to the SRAM cell 40 of FIG. 2 are referenced with like numerals or letters. The SRAM cell 60 is considered loadless because it uses a storage circuit 66 in which the loads formed by the pull-up transistors 54, 58 have been eliminated. Further, the NMOS access transistors 42 and 44 have been replaced with PMOS transistors 62 and 64, respectively. With the loadless 4-T SRAM cell 60 of FIG. 3, there are no pull-up transistors to maintain the drain of the OFF NMOS transistor 52, 56 at a voltage that is sufficient to turn ON the other NMOS transistor 52, 56. Instead, the access transistors 62, 64 are biased in their OFF states by conventional means with a voltage that causes leakage currents and/or subthreshold currents to be coupled from the digit lines D, D* through the access transistors 62, 64. These leakage currents and/or subthreshold currents maintain the voltage on the drain of the OFF NMOS transistor 52, 56, at a voltage that is sufficiently high to maintain the other NMOS transistor 52, 56 in an ON condition. In order to supply these leakage currents and/or subthreshold currents, the PMOS bias transistors 20 (FIG. 1) are controlled by the digit line load signals $DLL_N$ to supply currents to the digit lines D, D* when the memory cells 12 are not being accessed, as previously explained. However, the impedance of the transistors 20 must be sufficiently high that the digit lines D, D* in each pair can be driven low by the memory cells 12 and the write drivers 18.

The primary advantage of the 4-T SRAM cell 60 shown in FIG. 3 compared to the 6-T SRAM cell 40 shown in FIG. 2 is that the 4-T SRAM cell 60 uses only 4 transistors and is thus more compact. As a result, the 4-T SRAM cell 60 consumes less surface area on a semiconductor die.

Although the loadless 4T SRAM cell 60 of FIG. 3 has the advantage of being more compact, it also has some disadvantages compared to the 6-T SRAM cell 40 of FIG. 2. These disadvantages primarily result from the need to supply the correct amount of leakage and/or subthreshold current through the access transistors 62, 64, and the need to use PMOS access transistors 62, 64 rather than NMOS access transistors 42, 44. Too little leakage and/or subthreshold current supplied to the storage circuit 66 may cause a data retention failure. If too much leakage and/or subthreshold current is supplied to the storage circuit 66, then the standby current limits of an array using the SRAM cell 60 may be exceeded.

The primary advantage of the 4-T SRAM cell 60 shown in FIG. 3 compared to the 6-T SRAM cell 40 shown in FIG. 2 is that the 4-T SRAM cell 60 uses only 4 transistors and is thus more compact. As a result, the 4-T SRAM cell 60 consumes less surface area on a semiconductor die.

Although the loadless 4T SRAM cell 60 of FIG. 3 has the advantage of being more compact, it also has some disadvantages compared to the 6-T SRAM cell 40 of FIG. 2. These disadvantages primarily result from the need to supply the correct amount of leakage and/or subthreshold current through the access transistors 62, 64, and the need to use PMOS access transistors 62, 64 rather than NMOS access transistors 42, 44. Too little leakage and/or subthreshold current supplied to the storage circuit 66 may cause a data retention failure. If too much leakage and/or subthreshold current is supplied to the storage circuit 66, then the standby current limits of an array using the SRAM cell 60 may be exceeded.

Another problem resulting from the use of PMOS access transistors 62, 64 can be explained with reference also to FIG. 1. When power is initially applied to an integrated circuit containing the memory array 10, the digit lines D, D* can be driven to $V_{cc}$ before the word lines WL1–WL4 are driven high. With reference to FIG. 3, if the digit lines D, D* are at a high voltage when the voltage on the word line WL is low, the access transistors 62, 64 will be turned ON, thereby coupling the storage cell 66 to the digit lines D, D*. In fact, all of the SRAM cells 60 in the array 10 will generally be coupled to their respective digit lines D, D* under these circumstances. Although the leakage and/or subthreshold current drawn by any single SRAM cell 60 will be very small, the total current drawn by all of the SRAM cells 60 can be very large. For example, for a read current of as little as 100 microamperes ($10^{-4}$ amperes), the total current drawn by a 4 megabit SRAM array during power-up would be 400 amperes ($10^{-4} * 4 * 10^6$). Even though the current will not be this high in practice because of the finite current sourcing capability of the bias transistors 20, this amount of current is still far too much current to be drawn by SRAM memory devices.

Note that the problem of excessive currents at power-up does not exist for the 6-T SRAM cell 40 shown in FIG. 2 because the NMOS access transistors 42, 44 will be OFF if the voltages of the word lines WL are less than the voltages on the digit lines D, D*. However, although not commonly in use, there may be circuit designs in which excessive power-up currents could be a problem even with NMOS access transistors 42, 44.

There is therefore a need for a system and method to limit the current drawn by SRAM arrays during power-up, particularly for arrays of SRAM cells having PMOS access transistors, such as loadless 4-T SRAM cells.

SUMMARY OF THE INVENTION

An array of SRAM cells arranged in rows and columns includes a wordline for each row of the array and a pair of complementary digit lines for each column of the array. Each of the SRAM cells has a pair of access transistors coupled to respective complementary digit lines for a respective column and a gate coupled to a wordline for a respective row. A bias circuit coupled to each of the digit lines is operable in either a normal mode or a power-up mode. In the normal mode, the bias circuit couples a bias current to the digit lines. In the power-up mode, the bias circuit maintains the access transistors non-conductive.

DETAILED DESCRIPTION OF THE INVENTION

Figure 1:
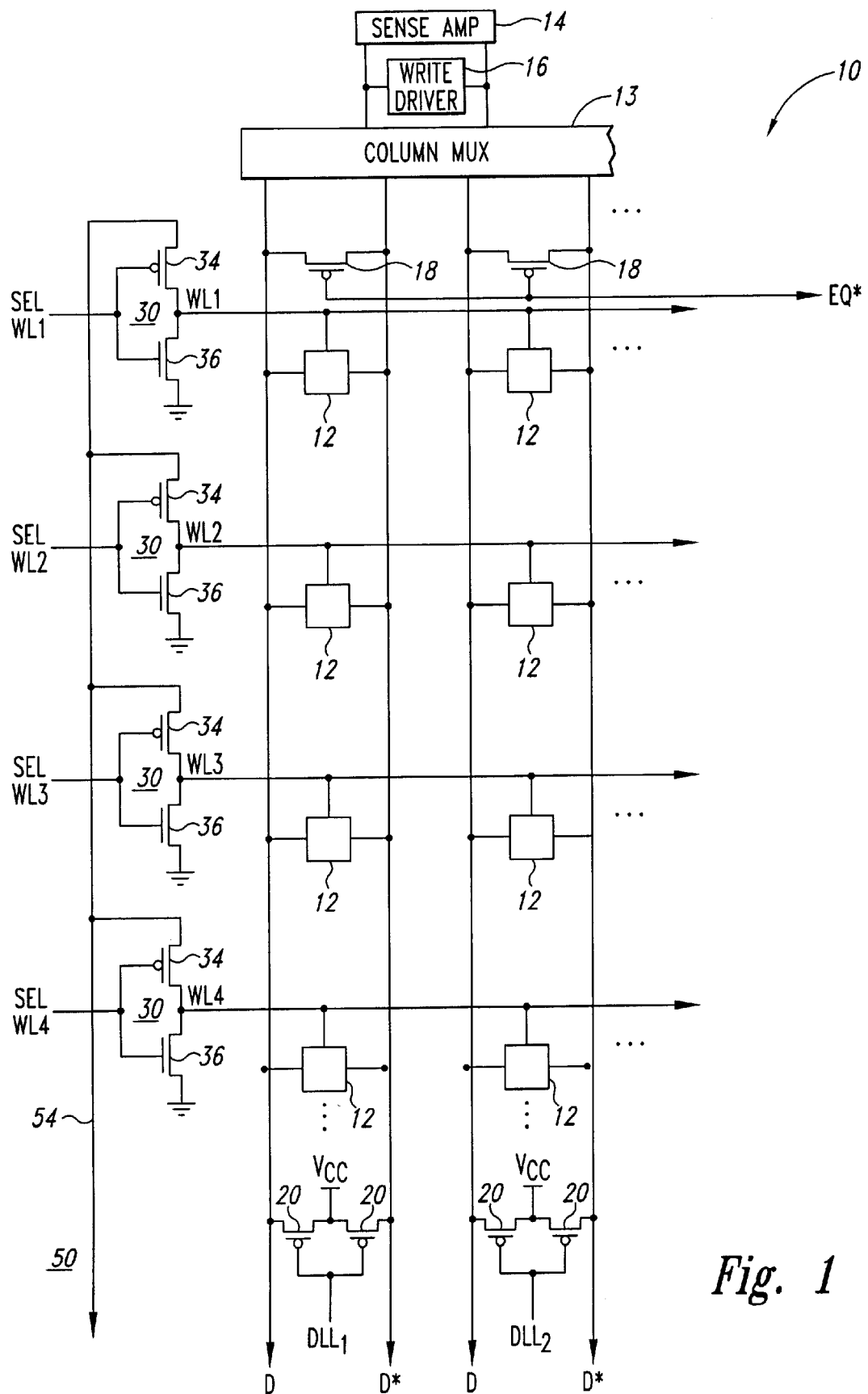
FIG. 1 is a block diagram of a conventional SRAM array.
Figure 2:
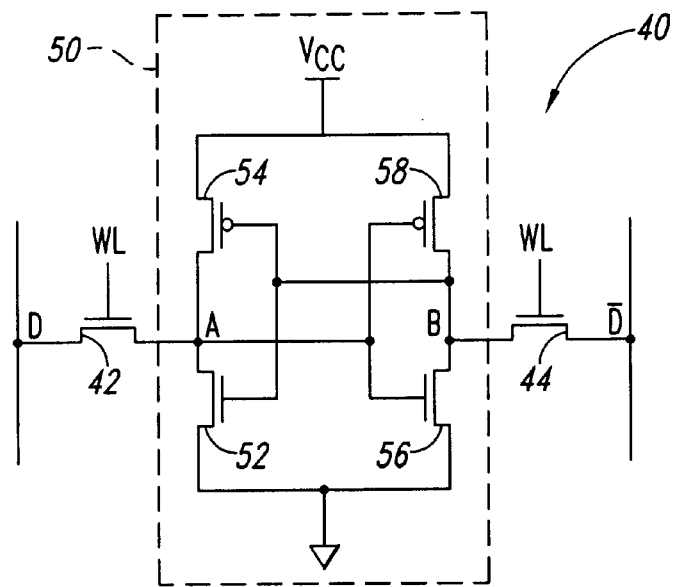
FIG. 2 is a schematic of a conventional 6-T SRAM cell.
Figure 3:
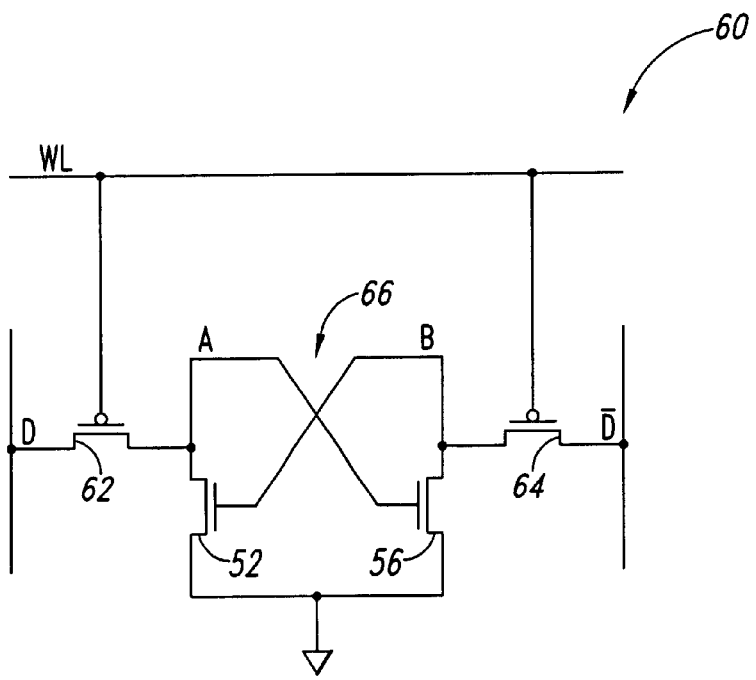
FIG. 3 is a schematic of a conventional loadless 4-T SRAM cell.
Figure 4:
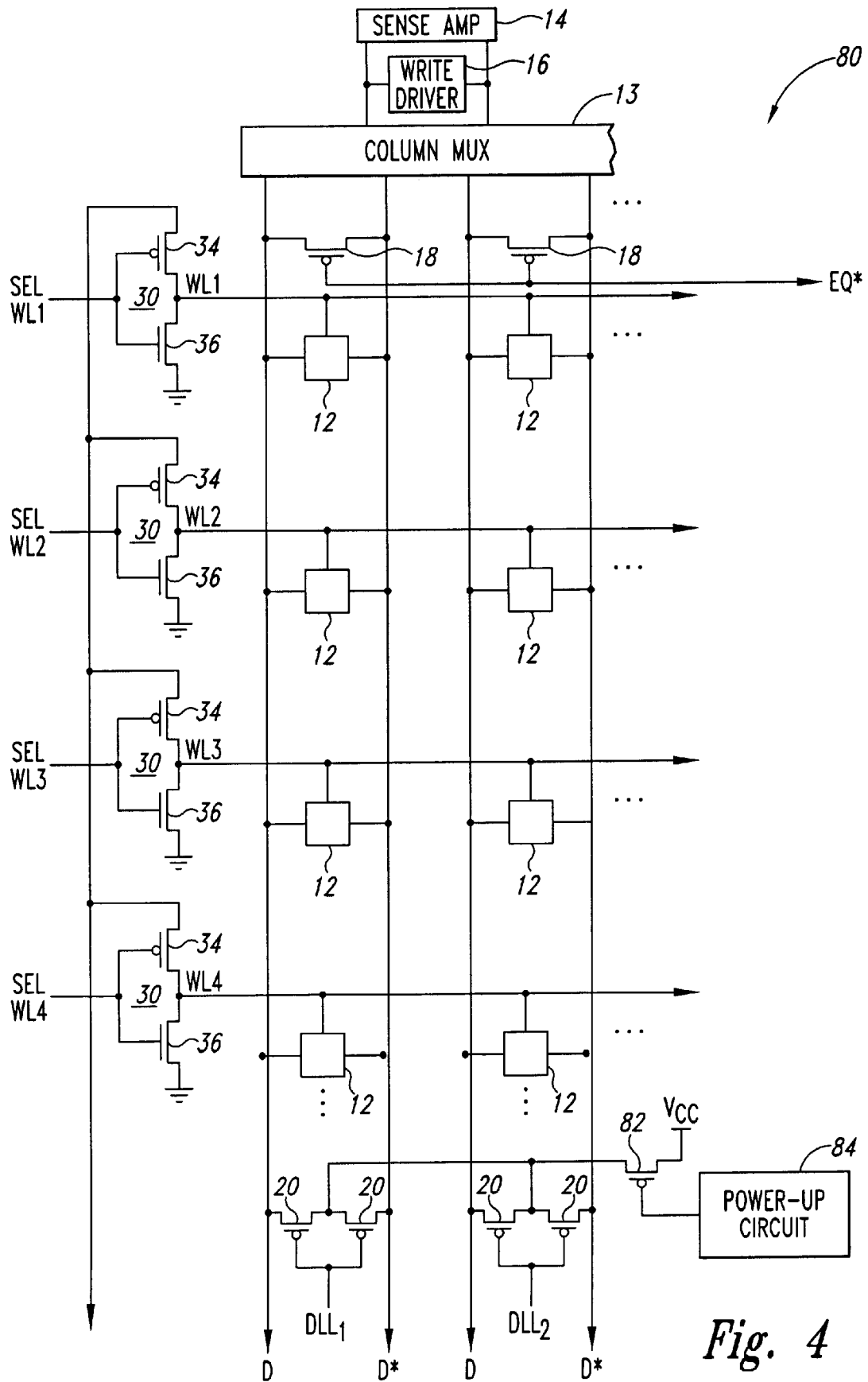
FIG. 4 is a block diagram of an SRAM array according to one embodiment of the invention.

FIG. 4 is a block diagram of an SRAM array 80 according to one embodiment of the invention where elements common to the SRAM array 10 of FIG. 1 are referenced with like numerals or letters. The SRAM array 80 differs from the SRAM array 10 of FIG. 1 by coupling the sources of the PMOS bias transistors 20 to the supply voltage $V_{cc}$ through a PMOS bias supply transistor 82 rather than directly to $V_{cc}$, as in the SRAM array 10 of FIG. 1. The gate of the bias supply transistor 82 is coupled to a power-up circuit 84. The power-up circuit 84 is designed to turn OFF the bias supply transistor 82 to remove power $V_{cc}$ from the bias transistors 20 at power-up at least until voltages in the SRAM array 80 have stabilized. As a result, the voltage on the digit lines D, D* remain at zero volts during power-up to prevent the PMOS access transistors 62, 64 (FIG. 3) from turning ON during power-up. When the voltage on the word lines WL1–WL4 have stabilized as a sufficiently high voltage to maintain the PMOS access transistors 62, 64 (FIG. 3) OFF, the power-up circuit 84 turns ON the bias supply transistor 82. The bias supply transistor 82 then supplies power $V_{cc}$ to the bias transistors 20 to allow the bias transistors 20 to supply a leakage current to each digit line D, D* that is sufficiently high to allow each SRAM cell 12 to store data.

Figure 5:
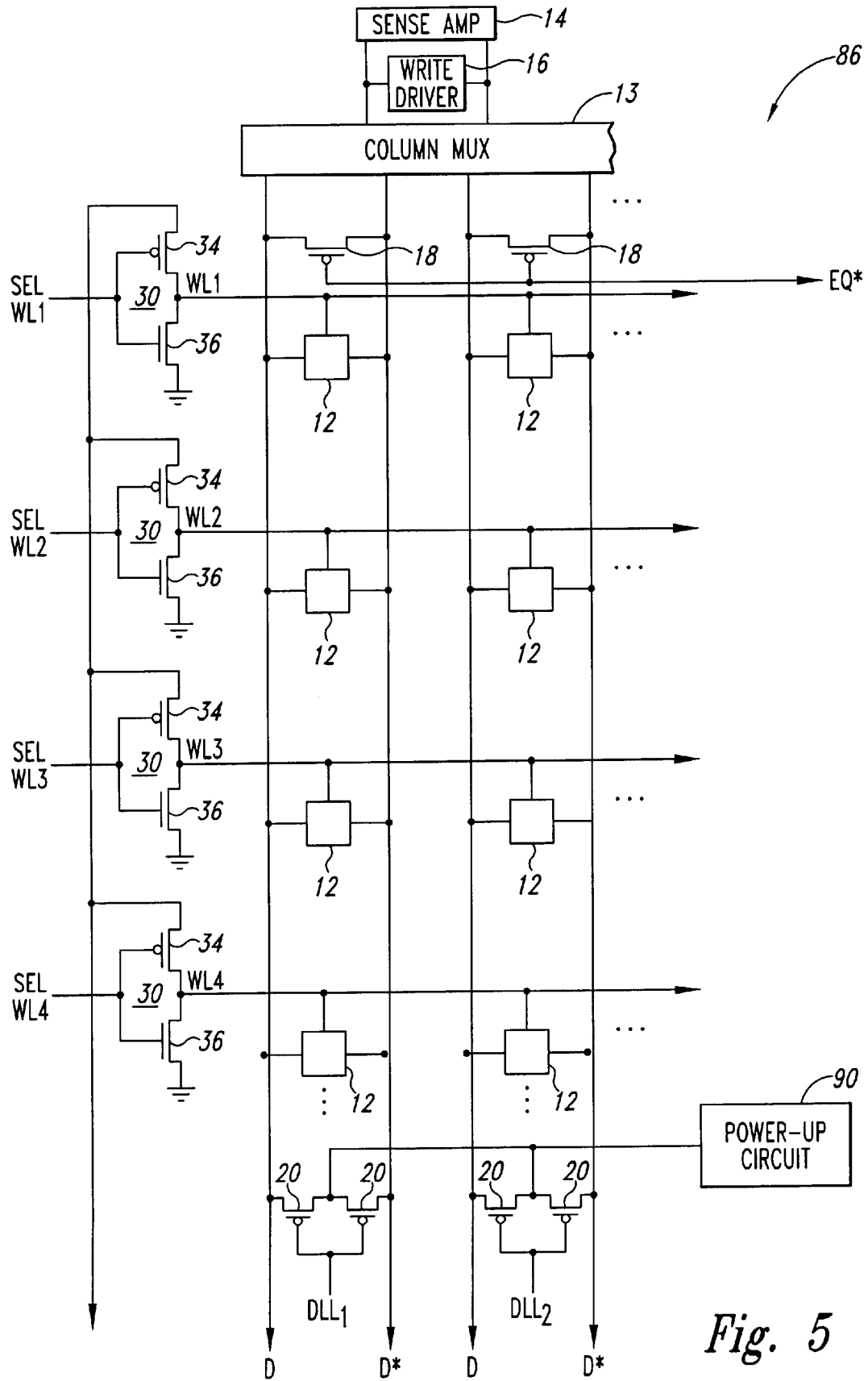
FIG. 5 is a block diagram of an SRAM array according to another embodiment of the invention.

In another embodiment of the invention shown in FIG. 5, an SRAM array 86 operates in essentially the same manner as the power-up circuit 84 of FIG. 4 except that a voltage is applied to the sources of the PMOS bias transistors 20 by a power-up circuit 90 rather than by a bias supply transistor 82 as in the embodiment of FIG. 4. The power-up circuit supplies a voltage to the sources of the PMOS bias transistors 20 that is maintained at a relatively low voltage, preferably ground, during power-up. As a result, the voltages on the digit lines D, D* remain at zero volts during power-up to prevent the PMOS access transistors 62, 64 (FIG. 3) from turning ON during power-up. Once the voltages in the SRAM array 60 have stabilized, the power-up circuit 90 supplies a voltage to the sources of the bias transistors 20 that allows the bias transistors 20 to supply a leakage current to each digit line D, D* that is sufficiently high to allow each SRAM cell 12 to store data.

Figure 6:
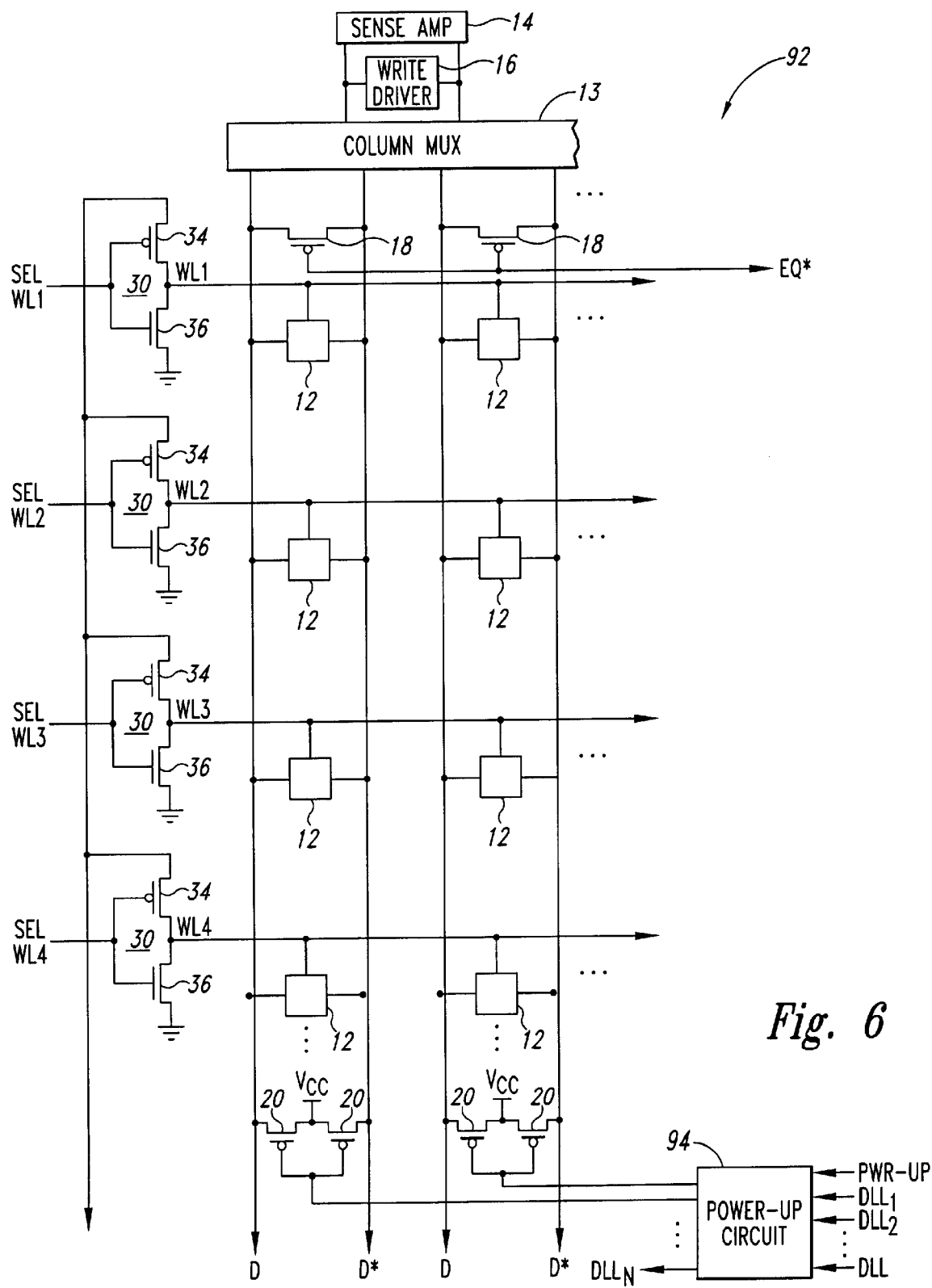
FIG. 6 is a block diagram of an SRAM array according to a further embodiment of the invention.

In another embodiment of the invention shown in FIG. 6, an SRAM array 92 includes a power-up circuit 94 having respective outputs that are coupled to the gate of each of the PMOS bias transistors 20. The power-up circuit 94 receives a PWR-UP signal that is active high during power-up, and a digit line load DLL signal. During power-up, the power-up circuit 94 responds to the active high PWR-UP signal to apply a voltage to the gate of each bias transistor 20 that increases at least as fast as the the voltage $V_{cc}$ supplied to the sources of the PMOS bias transistors 20. As a result, the bias transistors 20 cannot turn ON to apply a voltage to the digit lines D, D* that is sufficient to allow the access transistors 62, 64 (FIG. 3) to turn ON during power-up. Once the voltages in the SRAM array 92 have stabilized, the power-up circuit 94 couples the DLL signals to the gates of respective bias transistor 20, which then bias the digit lines D, .D* to supply a suitable leakage current. Although the bias transistor 20 is shown in FIG. 6 as being a PMOS transistor, it will be understood the power-up circuit 94 may instead be used with an SRAM array having NMOS bias transistors (not shown).

Figure 7:
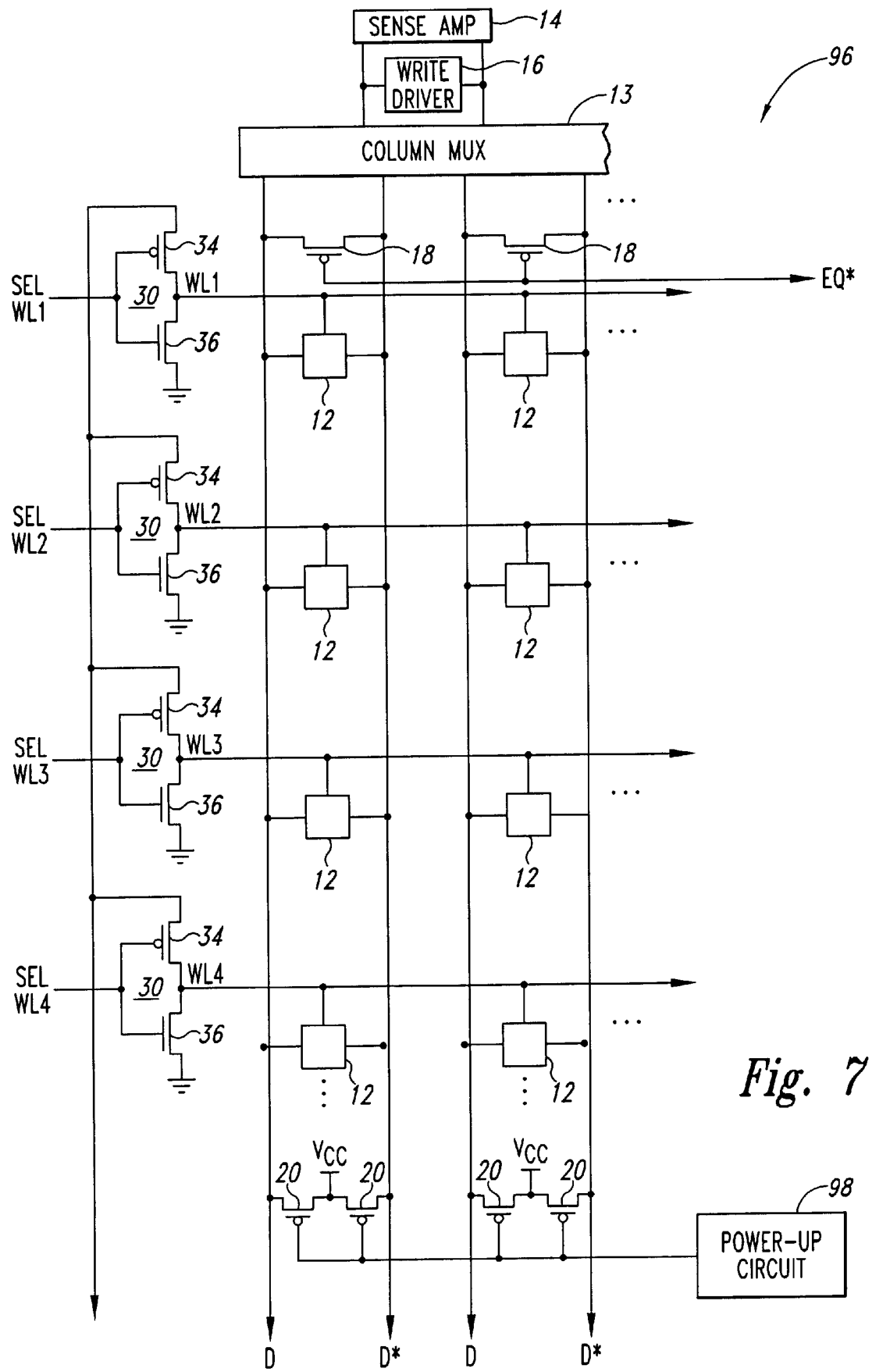
FIG. 7 is a block diagram of an SRAM array according to a further embodiment of the invention.

In another embodiment of the invention shown in FIG. 7, an SRAM array 96 includes a power-up circuit 98 coupled to the gates of the PMOS bias transistors 20. The power-up circuit 90 supplies a voltage to the gates of the bias transistors 20 that increases at least as fast as the voltage $V_{cc}$ supplied to the sources of the PMOS bias transistors 20. As a result, the bias transistors 20 cannot turn ON to apply a voltage to the digit lines D, D* that is sufficient to allow the access transistors 62, 64 (FIG. 3) to turn ON. Once the voltages in the SRAM array 96 have stabilized, the power-up circuit 98 supplies a voltage to the gates of the bias transistors 20 that is sufficiently low to turn ON the bias transistors 20. The bias transistors 20 can then apply a sub-threshold current to the access transistors 62, 64.

Figure 8:
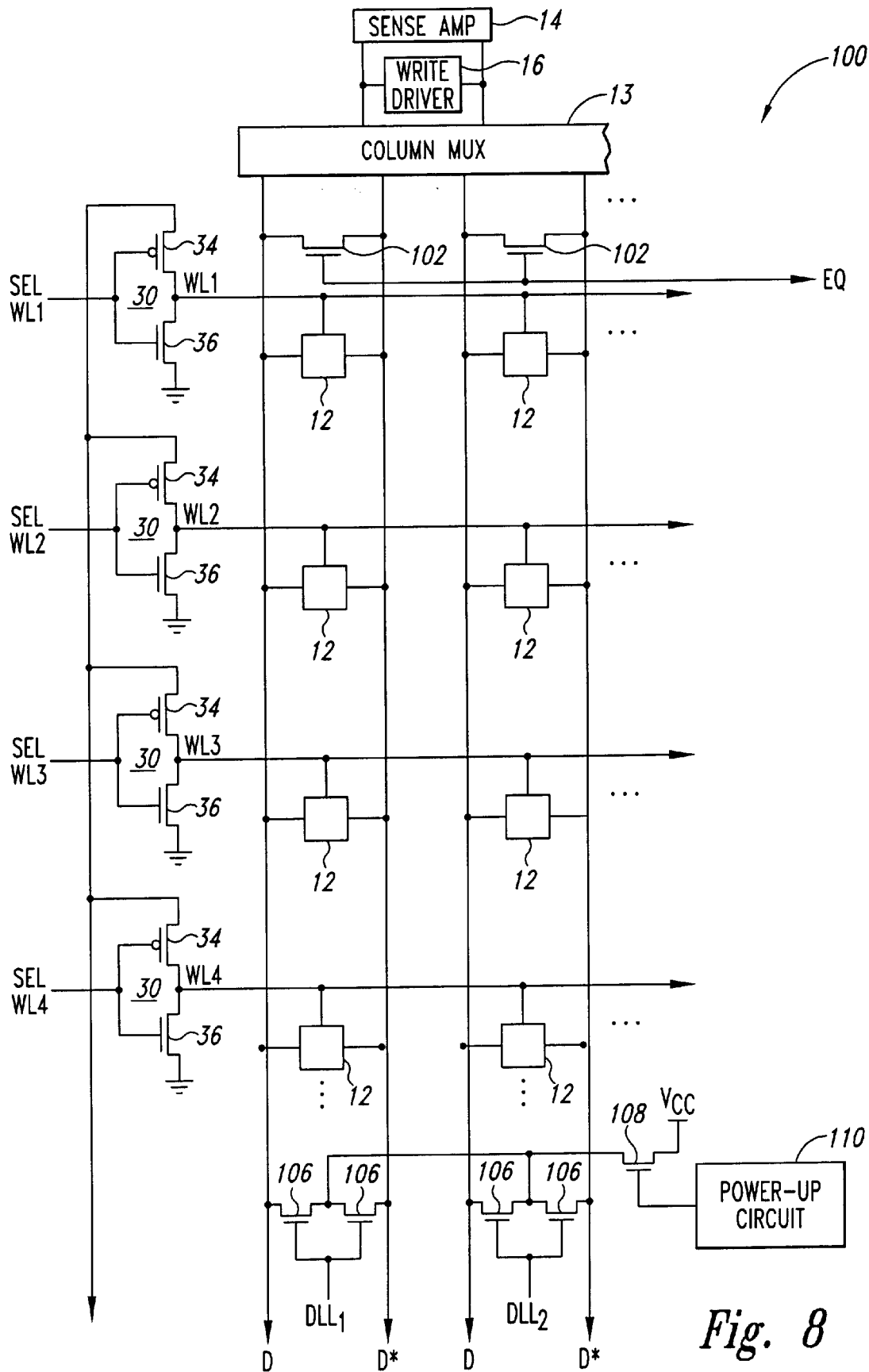
FIG. 8 is a block diagram of an SRAM device using one of the SRAM array of FIG. 4, 6 or 7.

An SRAM array 100 according to still another embodiment of the invention is shown in FIG. 8. The SRAM array 100 is identical to the SRAM array 80 of FIG. 4 except that NMOS equalization transistors 102 are used rather than PMOS transistors 18, which are used in the SRAM array 80, NMOS bias transistors 106 are used rather than PMOS bias transistors 20, which are used in the SRAM array 80, and an NMOS bias supply transistor 108 is used rather than a PMOS bias supply transistor 82, which is used in the SRAM array 80. As a result, the equalization transistors 102 are turned ON by an active high EQ signal rather than an active low EQ* signal, and the bias supply transistor 108 is turned ON by a high at the output of a power-up circuit 110 rather than by a low generated by the power-up circuit 84.

Although specific designs for the power-up circuits 84, 90, 94, 98, 110 have not been shown or described, conventional power-up circuits may either be used or easily adapted for use as the power-up circuits 84, 90, 94, 98, 110. Suitable designs are disclosed, for example, in U.S. Pat. No. 5,555,166 to Sher, U.S. Pat. No. 5,557,579 to Raad et al., and U.S. Pat. No. 5,898,625 to Manning, all of which are incorporated herein by reference.

Figure 9:
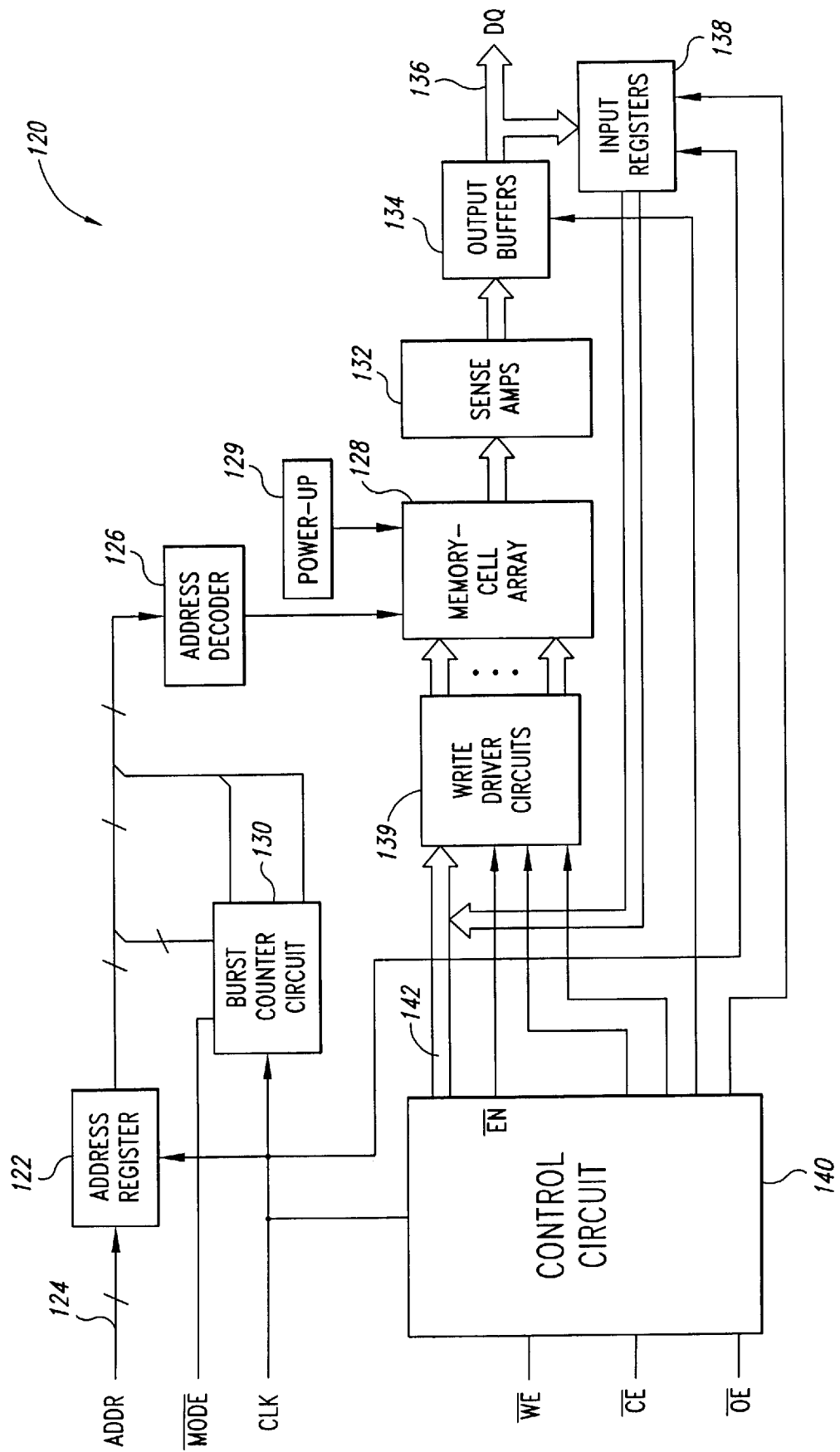
FIG. 9 is a block diagram of a computer system using the SRAM device of FIG. 8 as a cache memory.

FIG. 9 is a functional block diagram of a synchronous SRAM 120 including an SRAM power-up circuit according to the present invention. In the synchronous SRAM 120, all operations are referenced to a particular edge of an external clock signal CLK, typically the rising edge, as known in the art. The synchronous SRAM 120 includes an address register 122 which latches an address received on an address bus 124 in response to the external clock signal CLK. An address decoder 126 receives the latched address from the address register 122 and outputs a decoded address to a memory-cell array 128 including a number of loadless 4-T SRAM memory cells (not shown in FIG. 8) arranged in rows and columns. An SRAM power-up circuit 129, which may be one of the power-up circuits 84, 90, 94, 98, 110, is coupled to the array 128. The latched address stored in the address register 122 is also output to a burst counter circuit 130 receiving the external clock signal CLK and a mode signal MODE. In response to the external clock signal CLK, the burst counter circuit 130 develops sequential addresses beginning with the memory address latched by the address register 122, and outputs the sequential addresses to the address decoder 126. The mode signal MODE determines whether the sequence of memory addresses developed by the burst counter circuit 130 is a linear burst sequence or an interleaved burst sequence.

Sense amplifiers 132, such as the sense amplifiers 14 shown in FIGS. 4–8 are coupled to respective columns of the memory-cell array 128 and operate to sense the data stored in addressed memory cells in the memory-cell array 128, as previously explained. The sense amplifiers 132 output the sensed data through output buffers 134 and onto a data bus 136. An input register 138 latches data placed on the data bus 136 in response to the external clock signal CLK. The data latched in the input register 138 are output to write driver circuits 139, such as the write drivers 16 of FIGS. 4–8. The write driver circuits 139 are, in turn, coupled to the memory-cell array 128 and operate as previously described to write data to addressed memory cells in the memory-cell array 128.

The synchronous SRAM 120 further includes a control circuit 140 that controls operation of the various components of the synchronous SRAM 120 during data transfer operations and during testing of the synchronous SRAM. The control circuit 140 receives the external clock signal CLK, an output enable signal OE, a chip enable signal CE, and a write enable signal WE, and generates a number of internal control signals to control the various components of the synchronous SRAM 120 in response to these signals. In addition, the control circuit 140 develops appropriate signals to actuate the SRAM power-up circuit 129 when power is initially applied to the SRAM 120.

During a read data transfer operation, an external circuit (not shown in FIG. 9) places an address on the address bus 124, activates the output enable signal OE and the chip enable signal CE, and deactivates the write enable signal WE. The address on the address bus 124 is latched by the address register 122 on the next rising edge of the external clock signal CLK. In response to the deactivated write enable signal WE, the control circuit 140 disables the input register circuit 138 and places the output buffers 134 in a low impedance state coupling the sense amplifiers 132 to the data bus 136 through the output buffers 134. Typically, on the next subsequent rising edge of the external clock signal CLK, the latched address stored in the address register 122 is output to the address decoder 126, which decodes the memory address and activates the addressed memory cells in the memory-cell array 128. The sense amplifiers 132 thereafter sense the data stored in the addressed memory cells and outputs the data to the output buffers 134 which, in turn, places the data on the data bus 136 where it is available to be read by the external circuit.

During a write data transfer operation, the external circuit places an address on the address bus 124, data on the data bus 136, deactivates the output enable signal OE, and activates the chip enable signal CE and write enable signal WE. In response to the active write enable signal WE and inactive output enable signal OE, the control circuit 140 places the output buffers 134 in a high impedance state and enables the input register 138. On the next subsequent rising edge of the external clock signal CLK, the address register 122 latches the address placed on the address bus 124, and the input register 138 latches the data placed on the data bus 136. Typically on the next subsequent rising edge of the external clock signal CLK, the latched address is output to the address decoder 126, which decodes the address and activates the addressed memory cells in the memory-cell array 128, and the latched data stored in the input register 138 is output to the write driver circuits 139. The write driver circuits 139 operate as previously described to write the data to the addressed memory cells in the memory-cell array 128.

Figure 10:
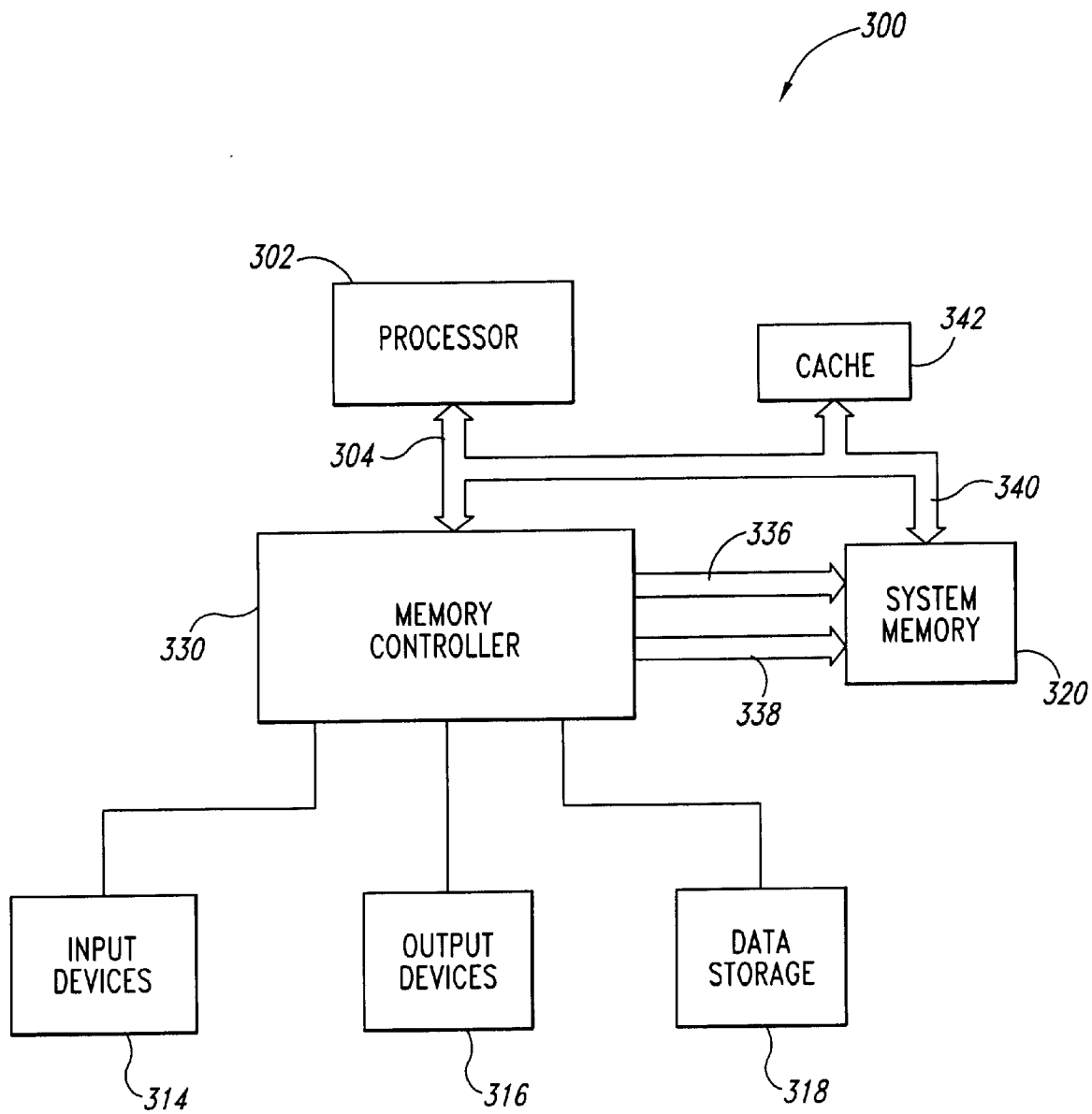

FIG. 10 shows a computer system that may use an SRAM containing an embodiment of the SRAM power-up circuit according to the present invention. The computer system 300 includes a processor 302 for performing various computing functions, such as executing specific software to perform specific calculations or tasks. The processor 302 includes a processor bus 304 that normally includes an address bus, a control bus, and a data bus. In addition, the computer system 300 includes one or more input devices 314, such as a keyboard or a mouse, coupled to the processor 302 to allow an operator to interface with the computer system 300. Typically, the computer system 300 also includes one or more output devices 316 coupled to the processor 302, such output devices typically being a printer or a video terminal. One or more data storage devices 318 are also typically coupled to the processor 302 to allow the processor 302 to store data in or retrieve data from internal or external storage media (not shown). Examples of typical storage devices 318 include hard and floppy disks, tape cassettes, and compact disk read-only memories (CD-ROMs). The processor 302 is also typically coupled to system memory 320, which is normally dynamic random access memory ("DRAM") through a memory controller 330. The memory controller 330 normally includes a control bus 336 and an address bus 338 that are coupled to the system memory 320. A data bus 340 is coupled from the system memory 320 to the processor bus 304 either directly (as shown), through the memory controller 330, or by some other means. Finally, the computer system 300 contains cache memory 342 for storing recently used instructions and data for faster access by the processor 302, as is well known to those skilled in the art. As is typical, the cache memory 342 is implemented by SRAM devices, in this case, the SRAM 120 shown in FIG. 9, because of the fast access times of SRAM devices.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A computer system, comprising:

a processor having a processor bus;

at least one input device coupled to the processor through the processor bus;

at least one output device coupled to the processor through the processor bus;

at least one data storage devices coupled to the processor through the processor bus;

a system memory coupled to the processor through the processor bus; and a static random access cache memory coupled to the processor through the processor bus, the static random access cache memory comprising:

an address bus;

a control bus;

a data bus;

an address decoder coupled to the address bus;

a read/write circuit coupled to the data bus;

a memory-cell array coupled to the address decoder, control circuit, and read/write circuit; the memory-cell array comprising:

an array of SRAM cells arranged in rows and columns, each of the SRAM cells including a pair of access switches each having an access terminal and a control terminal;

a wordline coupled to the control terminal of each of the access switches in a respective row;

a pair of complementary digit lines coupled to respective access terminals of each of the access switches in a respective column;

a respective sense amplifier coupled between the complementary digit lines in each of the pairs of complementary digit lines;

a respective write driver coupled between the complementary digit lines in each of the pairs of complementary digit lines; and a respective equilibration switch coupled between the complementary digit lines in each of the pairs of complementary digit lines;

a bias circuit coupled to each of the digit lines, the bias circuit being operable to couple a bias current to the digit lines in a normal mode and to couple a voltage to the digit lines that maintains the access switches non-conductive in a power-up mode; and a control circuit operable to control the operation of the SRAM.

2. The computer system of claim 1 wherein the bias circuit comprises:

a respective bias transistor coupled between a supply node and each of the digit lines;

a bias supply transistor coupled between a supply voltage and the supply node of each bias transistor; and a power-up circuit coupled to a gate of the bias transistor, the power-up circuit being operable in a normal mode to couple a voltage to the gate of the bias supply transistor that renders the bias supply transistor conductive, and being operable in the power-up mode to couple a voltage to the gate of the bias supply transistor that renders the bias supply transistor non-conductive.

3. The computer system of claim 2 wherein the bias supply transistor comprises a PMOS transistor coupled to a positive supply voltage, wherein each of the access switches comprise PMOS access transistors, wherein each of the SRAM cells comprise a loadless 4-T SRAM cell, wherein each of the bias transistors comprise a PMOS transistor, and wherein the power-up circuit is operable to couple substantially ground potential to the gate of the PMOS bias supply transistor in the normal mode and to couple the gate of the PMOS bias supply transistor to substantially the positive supply voltage in the power-up mode.

4. The computer system of claim 1 wherein the bias circuit comprises:

a respective bias transistor coupled between a supply terminal and each of the digit lines; and a power-up circuit coupled to the supply terminal of each of the bias transistors, the power-up circuit being operable in a normal mode to couple a supply voltage from the positive supply voltage to the supply terminal of each of the bias transistors, and being operable in the power-up mode isolate the power supply voltage from the supply terminal of each of the bias transistors.

5. The computer system of claim 4 wherein each of the SRAM cells comprise a loadless 4-T SRAM cell having PMOS access transistors, and wherein each of the bias transistors comprise a PMOS transistor.

6. The computer system of claim 1 wherein the bias circuit comprises:

a respective bias transistor coupled between a supply voltage and each of the digit lines; and a power-up circuit coupled to a gate of each of the bias transistors, the power-up circuit receiving a power-up signals and a digit line load signal corresponding to the bias transistors for each pair of complementary digit lines, the power-up circuit being operable in response to a power-up signal indicative of a normal mode to couple each of the digit line load signals to the gate of the respective bias transistor to renders the bias transistors conductive, and being operable in response to a power-up signal indicative of a power-up mode to couple a voltage to the gate of the bias transistors that renders the bias transistors non-conductive.

7. The computer system of claim 6 wherein each of the SRAM cells comprise a loadless 4-T SRAM cell having PMOS access transistors, and wherein each of the bias transistors comprise a PMOS transistor.

8. The computer system of claim 1 wherein the bias circuit comprises:

a respective bias transistor coupled between a supply voltage and each of the digit lines; and a power-up circuit coupled to a gate of each of the bias transistors, the power-up circuit being operable in a normal mode to apply a voltage to a gate of each of the bias transistors that renders the bias transistors conductive, and being operable in a power-up mode to apply a voltage to the gate of each of the bias transistors that renders the bias transistors non-conductive.

9. The computer system of claim 8 wherein each of the SRAM cells comprise a loadless 4-T SRAM cell having PMOS access transistors, and wherein each of the bias transistors comprise a PMOS transistor.

10. The computer system of claim 1 wherein each of the access switches comprise PMOS access transistors, wherein each of the SRAM cells comprise a loadless 4-T SRAM cell, and wherein the bias circuit is operable to couple a positive current to the digit lines in the normal mode and to terminate coupling the positive current from the digit lines in the power-up mode.

11. The computer system of claim 1 wherein each of the access switches comprise a transistor, the access terminal for each of the access switches comprises a drain or a source of the access transistor, and the control terminal for each of the access switches comprises a gate of the access transistor.

12. The computer system of claim 1, wherein the SRAM comprises a synchronous SRAM.

* * * * *